(12) United States Patent
Lam et al.

(10) Patent No.: US 8,179,680 B1
(45) Date of Patent: May 15, 2012

(54) METHOD AND APPARATUS FOR CONTROLLING REMOVAL OF A CIRCUIT BOARD MODULE FROM A CHASSIS

(75) Inventors: Mandy Lam, Fremont, CA (US);
Jimmy C. Leung, Fremont, CA (US);
Toan Nguyen, San Jose, CA (US);
Saeed Seyed, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 1120 days.

(21) Appl. No.: 12/070,768

(22) Filed: Feb. 21, 2008

(51) Int. Cl.
*H05K 7/16* (2006.01)
(52) U.S. Cl. ......... 361/726; 361/759; 361/754; 361/801
(58) Field of Classification Search .................. 361/726, 361/759, 754, 801
See application file for complete search history.

(56) References Cited

U.S. PATENT DOCUMENTS

| 6,373,713 | B1 * | 4/2002 | Jensen et al. | 361/759 |
| 6,388,884 | B1 * | 5/2002 | Greco et al. | 361/754 |
| 6,992,900 | B1 * | 1/2006 | Suzue et al. | 361/801 |
| 7,158,385 | B1 * | 1/2007 | Wang | 361/759 |

* cited by examiner

*Primary Examiner* — Yuriy Semenenko
*Assistant Examiner* — Andargie M Aychillhum

(57) ABSTRACT

A method and apparatus for controlling removal of a circuit board module from a chassis comprising an actuator and an electrical switch. The actuator having a locked state and an unlocked state, where the circuit board module is removable from the chassis when the actuator is in the unlocked state and the circuit board module is not removable when the actuator is in the locked state. The electrical switch is coupled to the actuator to produce a first signal indicating the locked state and a second signal indicating the unlocked state.

15 Claims, 6 Drawing Sheets

METHOD AND APPARATUS FOR CONTROLLING REMOVAL OF A CIRCUIT BOARD MODULE FROM A CHASSIS

FIELD OF THE INVENTION

The present invention relates to a circuit board module and, more particularly, to a method and apparatus for controlling removal of a circuit board module from a chassis.

BACKGROUND

Circuit board modules (i.e., line cards) that connect to backplanes typically include ejectors that, when rotated by technicians, enable the technicians to operatively connect the line cards with the backplanes, and disconnect the line cards from the backplanes. In particular, when a technician inserts a line card into a card cage (chassis) and then rotates a handle of the ejectors toward the card cage, the ends of the ejectors grab the card cage and guide the line card into connection with a backplane at the back of the card cage. Furthermore, when the technician rotates the handles of the ejectors away from the card cage, the ends of the ejectors push against the card cage and disconnect the line card from the backplane.

Generally, the ejectors are equipped with thumb screws on a faceplate of the circuit board module to provide secure contact between connectors of the backplane and connectors of the circuit board module. If the module is removed without first deactivating the module, signal loss occurs that may adversely affect the signal traffic being processed by the line card. Such an interruption can cause inefficient handling of data throughout a system in which the circuit board module participates.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF EXAMPLE EMBODIMENTS

Overview

Embodiments of the present invention include a method and apparatus for controlling removal of a circuit board module from a chassis comprising an actuator and an electrical switch. The actuator having a locked state and an unlocked state, where the circuit board module is removable from the chassis when the actuator is in the unlocked state and the circuit board module is not removable when the actuator is in the locked state. The electrical switch is coupled to the actuator to produce a first signal indicating the locked state and a second signal indicating the unlocked state.

DETAILED DESCRIPTION

Figure 1:
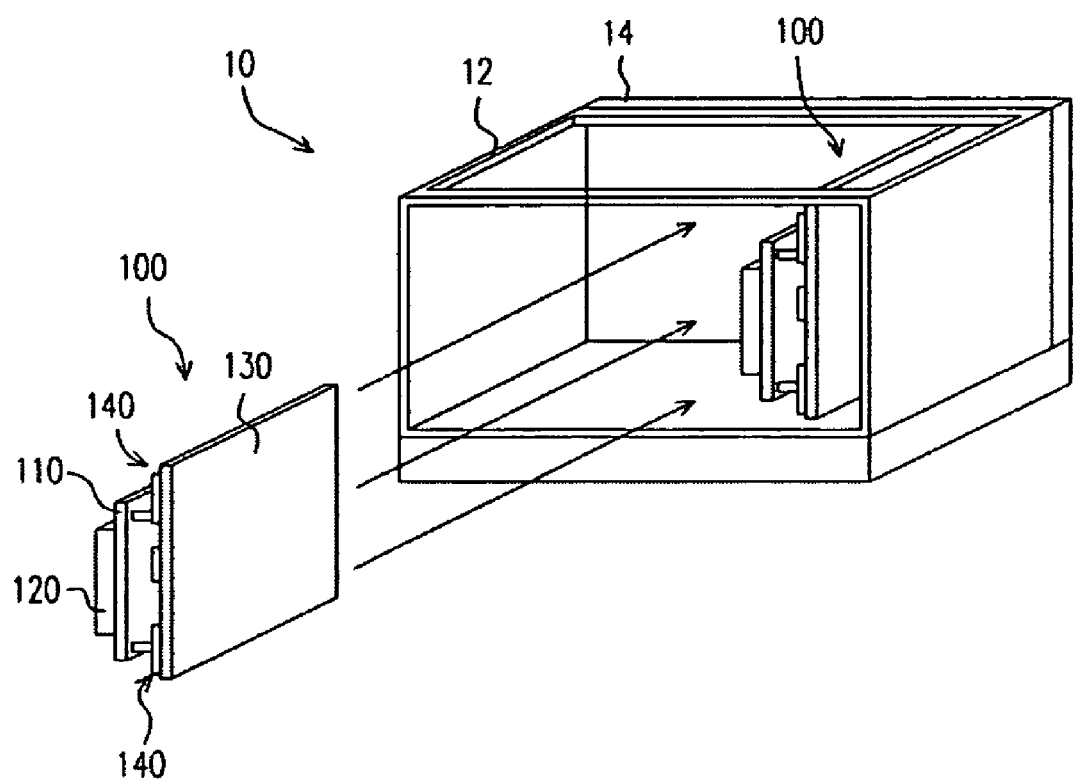
FIG. 1 is a perspective view of an example electronic system having at least one circuit board module.

FIG. 1 is a perspective view of an example electronic system that employs an ejector that facilitates safe removal of the circuit board module from a chassis in accordance with embodiments of the present invention. The electronic system 10 includes a chassis 12 and a motherboard 14 disposed within the chassis 12. The electronic system 10 comprises a circuit board module 100, which can be inserted in the chassis 12 to connect with the motherboard 14. The circuit board module 100 comprises a circuit board 110 and a set of circuit devices 120 mounted thereon. The circuit board module 100 comprises a support member 130 fastened to the circuit board 110 and at least one ejector 140 coupled to the support member 130. In the present embodiment, a pair of the ejectors 140 are applied for facilitating insertion and extraction of the circuit board module 100. For illustration purpose, only one ejector 140 is shown and described as an example below.

Figure 2:
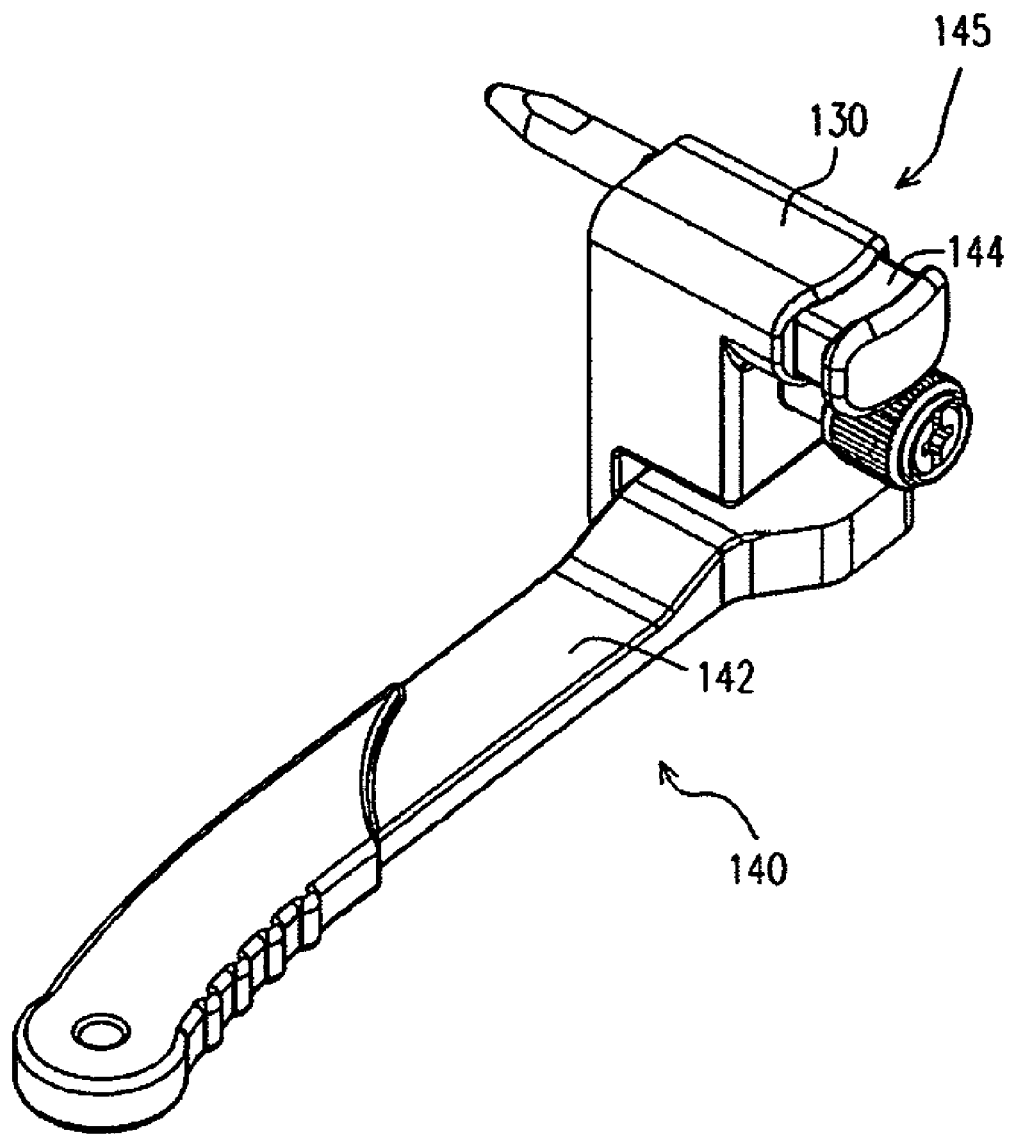
FIG. 2 is a perspective view of the ejector shown in FIG. 1.
Figure 3:
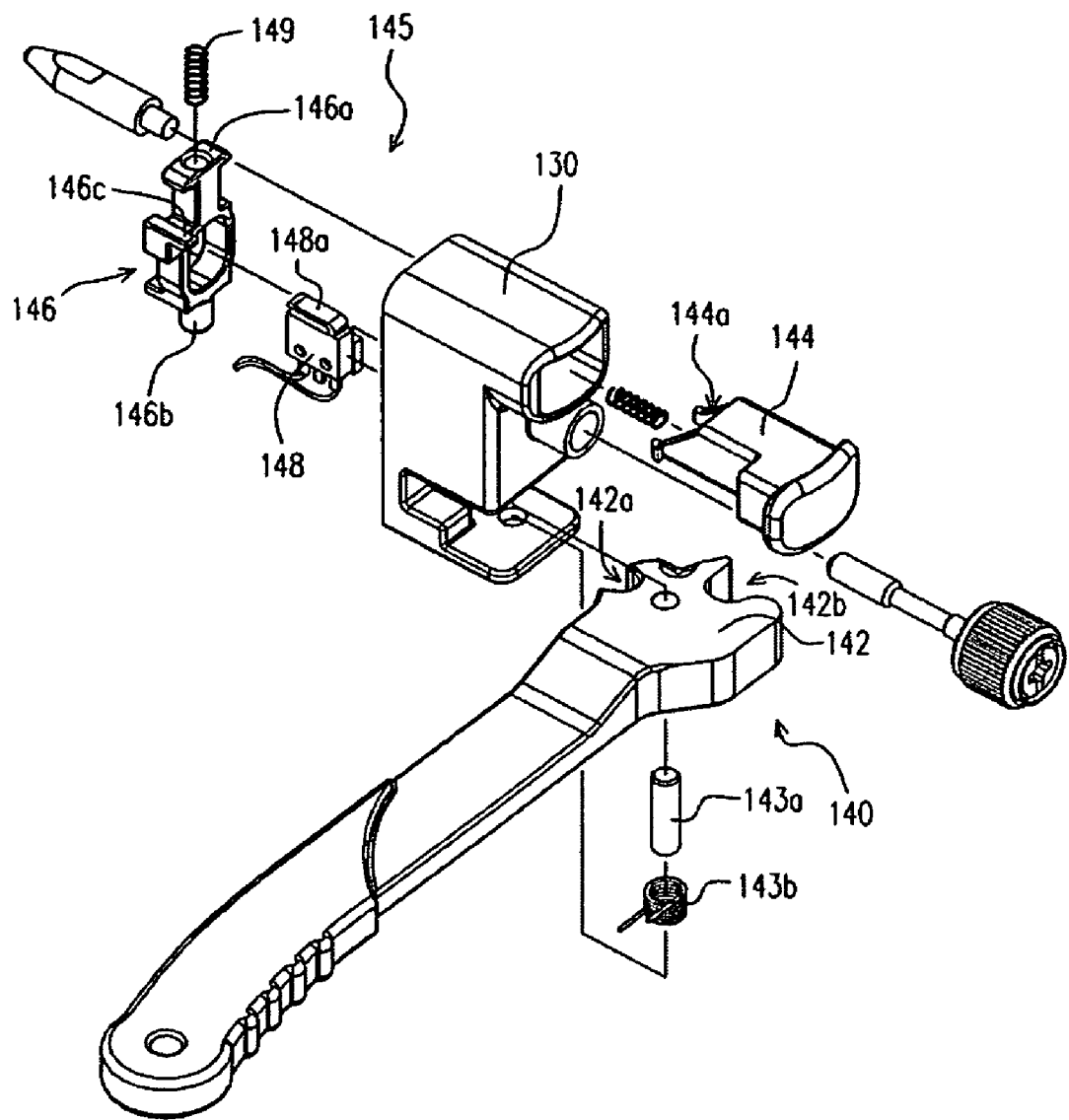
FIG. 3 is an exploded view of the ejector shown in FIG. 2.

FIG. 2 is a perspective view of the ejector 140 shown in FIG. 1. FIG. 3 is an exploded view of the ejector 140 shown in FIG. 2. FIGS. 2 and 3 show only a portion of the support member 130. The ejector 140 comprises a support member 130, a handle 142, a shaft 143a, an actuator 145 and a biasing spring 143b. The handle 142 is pivotally attached to the support member 130 via the shaft 143a passing through the support member 130 and the handle 142. The shaft 143a is press fit into the support member 130 to form an axle about which the handle rotates. The spring 143b is disposed between the support member 130 and the handle 142 in the open position. Although the shaft 143a is depicted as being a separate component in this embodiment, in other embodiments, the shaft 143a may be an integral element of the handle or an integral element of the support member 130.

The ejector 140 further comprises the actuator 145 for locking and unlocking the handle 142. The actuator 145 comprises a button 144, a plunger 146 and an electrical switch 148. The button 144 is slidably installed in the support member 130. The plunger 146 is slidably installed in the support member 130. The button 144 is coupled to the handle 142 via the plunger 146. The electrical switch 148 is installed in the support member 130 proximate to the plunger 146 such that the movement of the plunger 146 can activate or deactivate the electrical switch 148 i.e., change the state of the switch.

Figure 4:
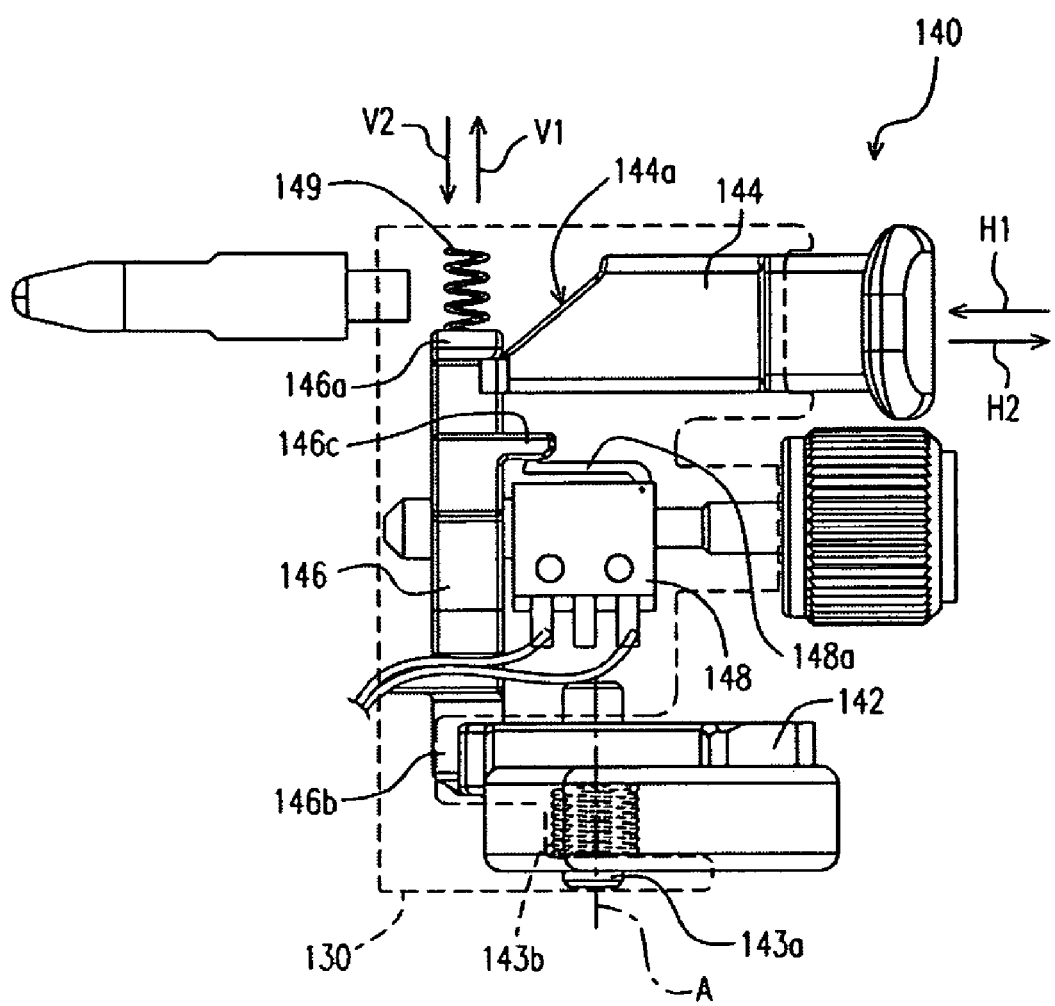
FIG. 4 is a side view of the ejector shown in FIG. 2 with the handle in a lock state and a closed position.
Figure 5:
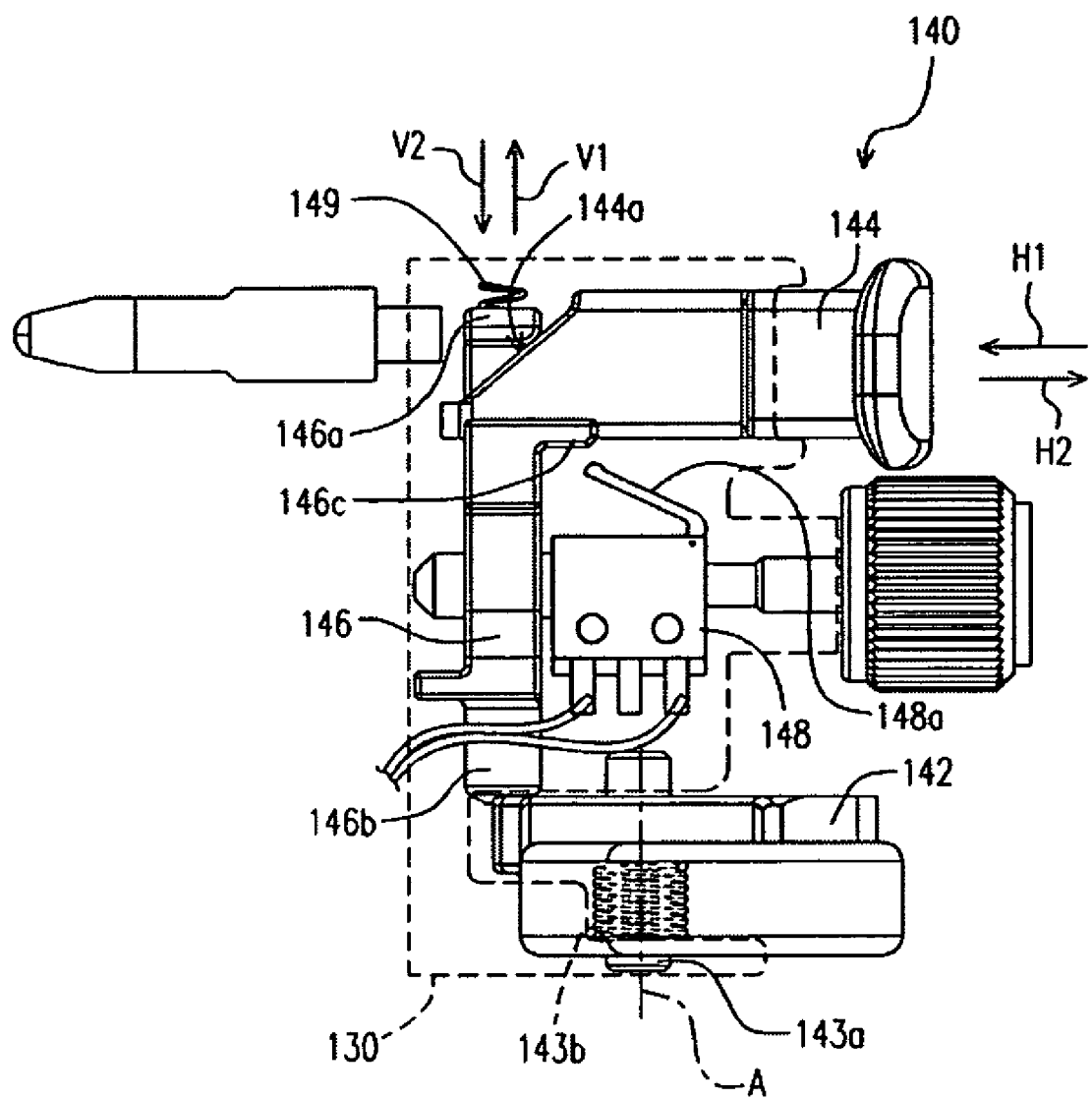
FIG. 5 is a side view of the ejector shown in FIG. 2 with the handle in an unlock state and a closed position.
Figure 6:
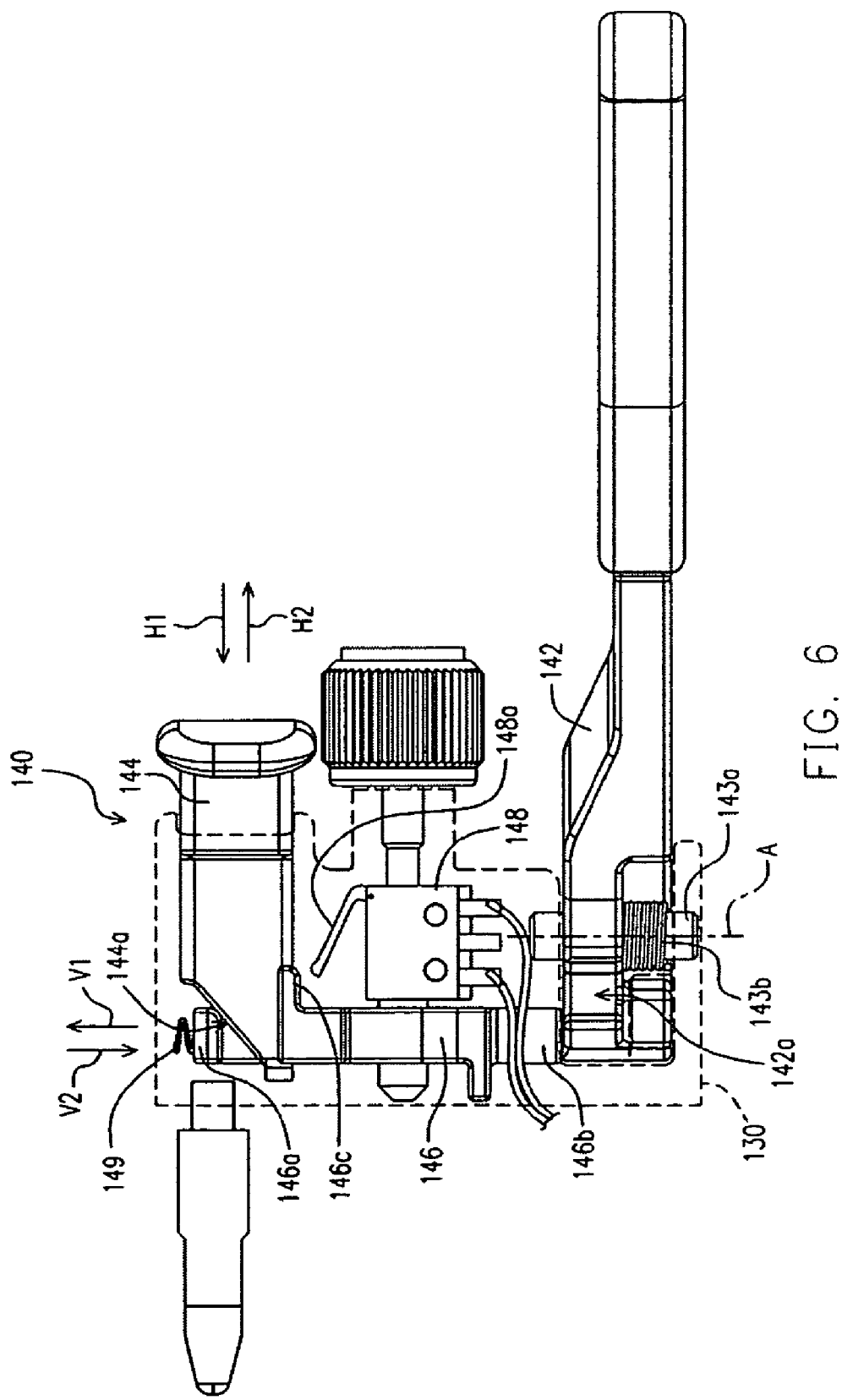
FIG. 6 is another side view of the ejector shown in FIG. 2 with the handle in a unlock state and an open position.

FIG. 4 is a side view of the ejector 140 shown in FIG. 2 with the handle 142 in a locked state and closed position. FIG. 5 is a side view of the ejector 140 shown in FIG. 2 with the handle in an unlocked state and closed position. FIG. 6 is a side view of the ejector 140 shown in FIG. 2 with the handle in an unlocked state and opened position. As illustrated in FIGS. 2, 4, 5 and 6, the button 144 is coupled to the handle 142 via the plunger 146. By depressing the button 144, the handle 142 can be rotated from a locked state as shown in FIGS. 4 and 5 to an unlocked state as shown in FIG. 6. As the handle is rotated, the plunger 146 moves to change the state of the switch 148.

The handle 142 of the ejector 140 is pivotally attached to the support member 130 such that the handle rotates about an axis A. The handle 142 swings between an opened position as shown in FIG. 5 and a closed position as shown in FIG. 6. The handle 142 is configured to grip chassis 12 in a traditional manner to apply insertion force as the handle is closed to reliably mate the circuit board module 100 with the motherboard 14. In the depicted embodiment, the handle 142 comprises a chassis interface detent 142b that interfaces with the chassis 12 to form a fulcrum to move the module 100 into the chassis 12.

In one embodiment, the plunger 146, which is slidably installed in the support member 130, is configured to move up and down from an unlocked position to a locked position. The plunger 146 comprises a block 146a, a latch 146b and a flange 146c. The block 146a forms the upper end portion of the plunger 146, the latch 146b forms the lower end portion of the plunger 146, and the flange 146c is located at a middle portion of the plunger 146. The ejector 140 further comprises a biasing spring 149 which is disposed between the support member 130 and the plunger 146 for biasing the plunger 146 to move downward. In the downward position, the latch 146b is inserted into a latch hole 142a of the handle 142 when the handle 142 is in the closed position. The insertion of the latch 146b locks the handle 142 in the closed position. It should be understood that, because of the interaction of the detent 142b with the chassis 12, the circuit board module 100 can only be removed when the handle 142 is in the opened position. It should be further understood that in order to swing the handle 142 to the opened position, the latch 146b of the plunger 146 must be released from the latch hole 142a of the handle 142; otherwise, the handle 142 cannot be swung to the opened position.

In one embodiment, the button 144 operates to either lock the circuit board module 100 or unlock the circuit board module 100. In the depicted embodiment, the button 144 comprises a ramp 144a. The ramp 144a is positioned corresponding to the block 146a such that when the button 144 is depressed into the support member 130, the ramp 144a of the button 144 moves forward. Such movement slidingly moves the block 146a of the plunger 146 upward so that the latch 146b of the plunger 146 is released from the latch hole 142a. Consequently, the handle 142 is unlocked. In this unlocked state, the handle 142 can be manually swung to the opened position to facilitate removal of the circuit board module 100 from the chassis 12.

In one embodiment, the electrical switch 148 is installed in the support member 130 proximate to the plunger 146 such that the movement of the plunger 146 can activate or deactivate the electrical switch 148. In the depicted embodiment, the electrical switch 148 comprises a trigger 148a for driving the electrical switch 148 to output a control signal to a processor or other circuitry to deactivate the circuit board module 100. According to this embodiment, when the button 144 is manually depressed into the support member 130, the ramp 144a of the button 144 moves forward. Such movement slidingly moves the block 146a of the plunger 146 upward so that the flange 146c of the plunger 146 releases the trigger 148a of the electrical switch 148. The switch 148 is thereby activated to output the control signal to deactivate the circuit board module 100. Meanwhile, the latch 146b of the plunger 146 is released from the latch hole 142a of the handle 142 to unlock the handle 142. In this unlocked state, the handle 142 can be manually swung to the opened position to facilitate the removal of the circuit board module 100 from the chassis 12. Thus, embodiments of the invention deactivate the circuit board module 100 before being removed out of the chassis 12. Consequently, signal traffic reliability of the electronic system 10 may be improved and the down time of the electronic system 10 due to traffic interruption/loss may be reduced.

Hereinafter, the operation of the ejector 140 is described with reference to FIGS. 4, 5 and 6 as follows. The circuit board module 100 is inserted into the chassis 12, and the handle 142 is manually swung to the closed position as shown in FIG. 5. The latch hole 142a will align with the latch 146b of the plunger 146 so that the latch 146b is forced into the latch hole 142a in a direction V2. As shown in FIG. 4, movement of the latch 146b is due to the biasing force of the biasing spring 149 on the plunger 146. Meanwhile, the ramp 144a of the button 144 is pushed in a direction H2 due to the downward movement of the block 146a of the plunger 146. In the locked state of the handle 142, the flange 146c compresses the trigger 148a to deactivate the electrical switch 148. To remove the circuit board module 100 from the chassis 12, the button 144 is manually depressed in a direction H1. In doing so, the ramp 144a of the button 144 moves forward to slidingly move the block 146a of the plunger 146 upward in a direction V1 as shown in FIG. 5. In response, the flange 146c of the plunger 146 releases the trigger 148a of the electrical switch 148 and thereby activates the electrical switch 148 to output the control signal. The control signal causes deactivation of the circuit board module 100. Meanwhile, the latch 146b of the plunger 146 is released from the latch hole 142a of the handle 142 to unlock the handle 142 as shown in FIG. 5. In this unlocked state, the handle 142 can be manually swung to the opened position as shown in FIG. 6 to facilitate removal of the circuit board module 100 from the chassis 12.

Therefore, the ejector 140 of the depicted embodiment ensures the deactivation of the circuit board module 100 prior to removal thereof so that the signal traffic reliability of the electronic system 10 may be improved and the down time of the electronic system 10 due to traffic interruption/loss may be reduced.

The foregoing ejector embodiment is known as an external ejector wherein the detent 142b that interacts with the chassis 12 is located "outside" or "in front of" a front panel of the circuit board module. The use of a circuit module activation/deactivation switch is also applicable to internal ejectors wherein the latch that interacts with the chassis is "inside" or "behind" a front panel of the circuit board module.

Additionally, the disclosure above describes deactivating the circuit board module before removing the card from the chassis. Similarly, the method and apparatus of embodiments of the present invention are equally applicable to maintaining the circuit board module in a deactivation state until the module is inserted and locked into the chassis.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An apparatus comprising: a support member; an actuator disposed in the support member comprising a plunger and a slidable button having a first position that places the actuator in a locked state and a second position that places the actuator in an unlocked state, where the circuit board module is removable from a chassis when the actuator is in the unlocked state and the circuit board module is not removable when the actuator is in the locked state; and an electrical switch, coupled to the plunger and configured to produce a first signal when the button is in the first position and a second signal the when the button is in the second position;
a handle pivotally mounted to the support member, wherein the plunger is coupled to the handle, and wherein movement of the button causes movement of the plunger that positions the plunger so as to prevent rotation of the handle.

2. The apparatus of claim 1 wherein the first signal and second signal are produced by having the electrical switch open or close depending upon a state of the actuator.

3. The apparatus of claim 1 further comprising a spring for biasing the plunger in a position that locks the handle, where the button, when depressed, overcomes the bias to unlock the handle.

4. The apparatus of claim 1, wherein the button has a proximal and a distal end, wherein the distal end comprises a ramp that causes movement of the plunger in a direction that is substantially perpendicular to the movement of the button.

5. The apparatus of claim 1, wherein the plunger comprises a latch that is insertable into a latch hole of the handle when the handle is in a closed position.

6. An ejector for a circuit board module comprising: a support member; a handle pivotally mounted to the support member that is positionable in a first handle position or a second handle position, wherein the first handle position allows the circuit board module to be removable from a chassis and the second handle position retains the circuit board module within the chassis;

an actuator disposed on the support member comprising a slidable button coupled, coupled to the handle via a plunger, wherein the button has a first actuator position for locking the handle and a second position for unlocking the handle; and an electrical switch coupled to the plunger so as to produce a first signal when the button is in the first position and a second signal when the button is in the second position; wherein movement of the button causes movement of the plunger that positions the plunger so as to prevent rotation of the handle.

7. The ejector of claim 6 wherein the first signal and second signals are produced by having the electrical switch open or close depending upon the position of the button.

8. The ejector of claim 6 further comprising a spring for biasing the plunger in a position that locks the handle, where the button, when depressed, overcomes the bias to unlock the handle.

9. The ejector of claim 6, wherein the button has a proximal and a distal end, wherein the distal end comprises a ramp that causes movement of the plunger in a direction that is substantially perpendicular to the movement of the button.

10. The ejector of claim 6, wherein the plunger comprises a latch that is insertable into a latch hole of the handle when the handle is in a closed position.

11. A circuit board module comprising:
a circuit board comprising at least one a circuit device mounted on the circuit board, and configured for being electrically activated and deactivated;
an ejector comprising:
a support member fastened to the circuit board; a handle pivotally attached to the support member, and configured to swing between a closed position and an opened position with respect to the support member;
a plunger installed in the support member, and configured to place the handle in a locked state or an unlocked state;
a button coupled to the plunger, and configured to drive the plunger to place the handle in the unlocked state; and
an electrical switch installed in the support member, and configured to cause the circuit device to become deactivated upon manipulation of the button to unlock the handle,
wherein the plunger comprises a flange for depressing a trigger of the electrical switch in the locked state of the handle.

12. The circuit board module as recited in claim 11, wherein the button is slidably installed in the support member.

13. The circuit board module as recited in claim 11, wherein the ejector further comprises a biasing spring located between the support member and the plunger for biasing the plunger to position the latch into the latch hole.

14. The circuit board module as recited in claim 11, wherein the ejector further comprises a biasing spring located between the support member and the plunger for biasing the plunger to position the flange to depress the trigger of the electrical switch.

15. The circuit board module as recited in claim 11, wherein the ejector further comprises a biasing spring located between the support member and the plunger for biasing the plunger to position the button.

* * * * *